(12) United States Patent
Jones et al.

(10) Patent No.: US 8,860,596 B1
(45) Date of Patent: Oct. 14, 2014

(54) REDUNDANT SIGNED DIGIT (RSD) ANALOG TO DIGITAL CONVERTER

(71) Applicants: Robert S. Jones, Austin, TX (US); Peijun Wang, Austin, TX (US)

(72) Inventors: Robert S. Jones, Austin, TX (US); Peijun Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/971,007

(22) Filed: Aug. 20, 2013

(51) Int. Cl.
*H03M 1/12* (2006.01)
(52) U.S. Cl.
CPC ........................................ *H03M 1/12* (2013.01)
USPC ........................................... 341/152; 341/172
(58) Field of Classification Search
CPC ...................................................... H03M 1/162
USPC .................... 341/155, 163, 172, 161
See application file for complete search history.

(56) References Cited

U.S. PATENT DOCUMENTS

| 6,489,914 B1* | 12/2002 | Jones et al. | 341/162 |
| 6,967,611 B2* | 11/2005 | Atriss et al. | 341/172 |
| 7,589,658 B2* | 9/2009 | Ren et al. | 341/161 |

OTHER PUBLICATIONS

Kim, M.G., et al., "A 10MS/s 11-b 0.19 mmΛ2 Algorithmic ADC with Improved Clocking Scheme", IEEE, 2006 Symposium on VLSI Circuits Digest of Technical Papers, Jun. 2006, pp. 1-2.

* cited by examiner

*Primary Examiner* — Jean B Jeanglaude
(74) *Attorney, Agent, or Firm* — James L. Clingan, Jr.; Mary Jo Bertani

(57) ABSTRACT

A redundant signed digit (RSD) analog to digital converter (ADC) includes an amplifier, a first variable capacitance circuit coupled to a first input to the amplifier, a second variable capacitance circuit coupled to a second input to the amplifier, a third variable capacitance circuit coupled to a first output of the amplifier, and a fourth variable capacitance circuit coupled to a second output of the amplifier. An output of the third and fourth capacitance circuits are coupled to one another and to inputs to the first and second variable capacitance circuits. Capacitance values of the first, second, third and fourth variable capacitance circuits are higher when inputs to the ADC correspond to a selected number of more significant bits than when inputs to the ADC correspond to a remaining number of less significant bits.

20 Claims, 4 Drawing Sheets

REDUNDANT SIGNED DIGIT (RSD) ANALOG TO DIGITAL CONVERTER

BACKGROUND

1. Field

This disclosure relates generally to semiconductor devices, and more specifically, to circuits for converting analog data to digital data.

2. Related Art

Digital signal processing has been proven to be very efficient in handling and manipulating large quantities of data. There are many products that are in common use such as wireless devices, digital cameras, motor controllers, automobiles, and toys, to name a few, that rely on digital signal processing to operate. Many of these products continuously receive information that is monitored and used to produce adjustments to the system thereby maintaining optimum performance. The data is often an analog signal that must be converted to a representative digital signal. For example, light intensity, temperature, revolutions per minute, air pressure, and power are but a few parameters that are often measured. Typically, an analog to digital (A/D) converter is the component used to convert an analog signal to a digital signal. In general, the conversion process comprises periodically sampling the analog signal and converting each sampled signal to a corresponding digital signal.

Many applications require the analog to digital converter(s) to sample at high data rates, operate at low power, and provide high resolution. These requirements are often contradictory to one another. Furthermore, cost is an important factor that directly correlates to the amount of semiconductor area needed to implement a design. One type of analog to digital converter that has been used extensively is a redundant signed digit (RSD) analog to digital converter. The RSD analog to digital converter typically comprises one or more RSD stages and a sample/hold circuit. In one embodiment, a sampled voltage is compared against a high reference voltage and a low reference voltage. The result of the comparison is used to determine 1.5 bits from the RSD stage. A residue voltage is then generated that is 2 times the sampled voltage plus or minus the reference voltage. The residue voltage is then provided to another RSD stage or fed back in a loop to continue the conversion process to extract bits until the least significant bit is generated.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
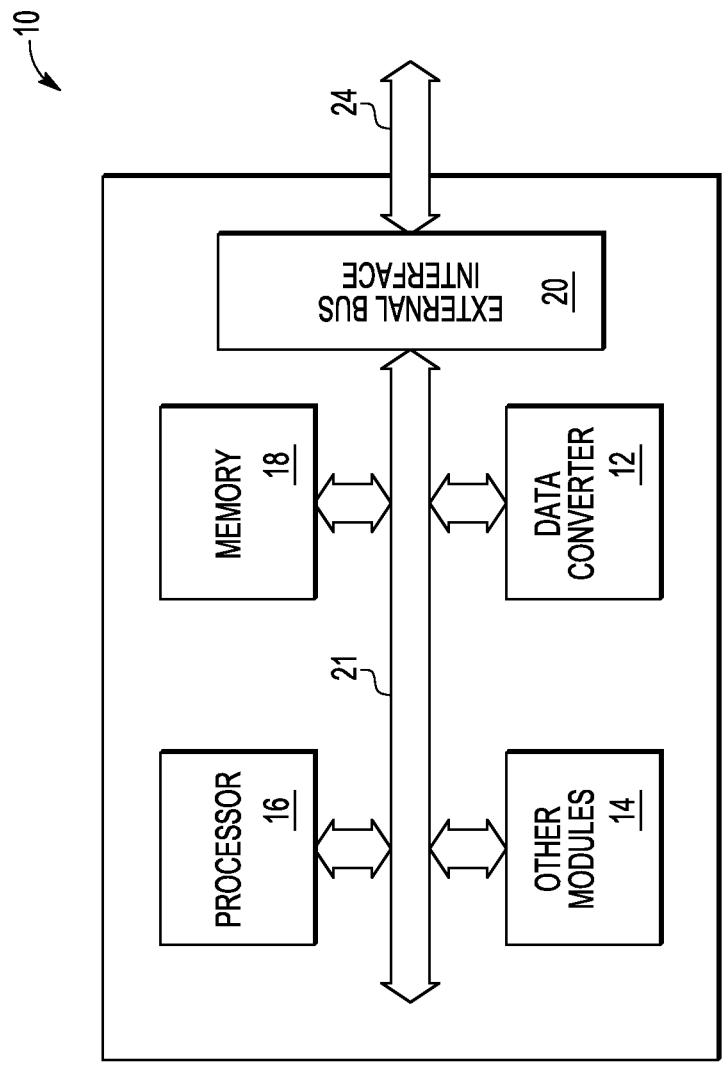
FIG. 1 is a schematic block diagram illustrating an embodiment of a processing system in which a data converter can be used.

The detailed description set forth below in connection with the appended drawings is intended as a description of some embodiments of the invention, and is not intended to represent the only forms in which the present invention may be practiced. It is to be understood that the same or equivalent functions may be accomplished by different embodiments that are encompassed within the spirit and scope of the invention. In the drawings, like numerals are used to indicate like elements throughout.

In one aspect, an RSD circuit, which functions as an analog to digital converter, is operated at a relatively high resolution for the most significant cycles and at a lower resolution for the lesser significant cycles in achieving the number of bits of digital output. The lower resolution operation requires less power and operates at a faster rate than the higher resolution operation. The result is an overall faster speed of operation and reduced power in achieving number of bits of digital output.

FIG. 1 illustrates one embodiment of a processing system 10. In alternate embodiments, system 10 may be implemented as a semiconductor device as a single integrated circuit, may be implemented as a plurality of integrated circuits, or may be implemented as a combination of integrated circuits and discrete components. Alternate embodiments may implement system 10 in any manner.

In one embodiment, system 10 comprises data converter 12, other modules 14, processor 16, memory 18, and external bus interface 20, which are all bi-directionally coupled to each other by way of a bus 21 or a plurality of electrical signals. In alternate embodiments, system 10 may comprises fewer, more, or different blocks of circuitry than those illustrated in FIG. 1.

Figure 2:
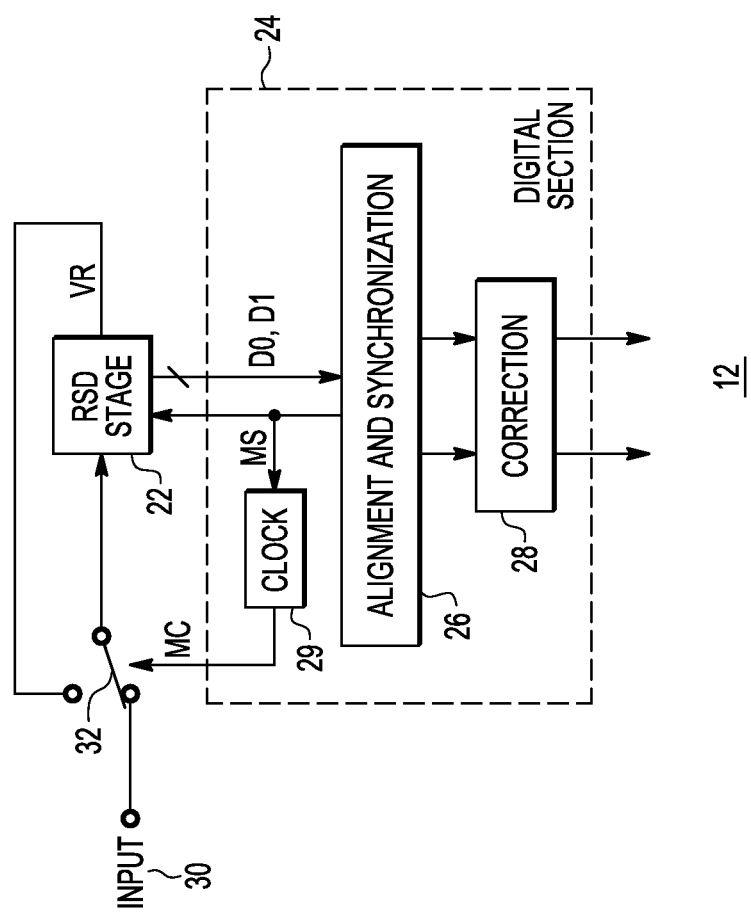
FIG. 2 is a schematic block diagram of a single stage RSD A/D converter in accordance with the present invention.

Referring now to FIG. 2, a block diagram of a cyclic analog to digital data converter 12 in accordance with the present invention is shown. The data converter 12 includes a single RSD stage 22 and a digital section 24.

An analog input signal is provided to the RSD stage 22 from an input terminal 30 by way of a first switch 32. The RSD stage 22 provides a digital output signal to the digital section 24. The RSD stage 22 also generates a residual voltage signal VR, which is fed back by way of the first switch 32. The first switch 32 is closed for the first cycle, in which the analog input signal is received, and then opened for the remaining number of cycles that it takes to complete converting the analog signal to a digital signal. The feedback loop of the RSD stage 22 can be directly connected from the RSD stage 22 output to the first switch 32. The number of cycles is related to the number of bits in the digital output signal. For example, for a twelve bit output signal, thirteen comparator clock cycles may be used.

The digital section 24, like the digital section 24 of data converter 12 shown in FIG. 1, has an alignment and synchronization block 26 and a correction block 28. The digital bits output from the RSD stage 22 are provided to the digital section 24, where they are aligned, synchronized, and combined to provide a standard format binary output code. There are a number of ways to perform the alignment and synchronization, such as taught in U.S. Pat. No. 5,644,313, and embodiments of the present invention are not intended to be limited to any particular technique.

In addition, data converter 12 is shown having a clock circuit 29 that generates a mode clock MC that changes frequency based on a state of a mode select MS and causes switch 32 to switch at the frequency of mode clock MC. During a first portion of cycles, mode select MS selects a relatively slow clock speed. During a second portion of cycles, MS selects a faster clock speed. Also shown is that RSD stage 22 provides digital signal D0 and digital signal D1 to alignment and synchronization block 26. Values of D0 and D1 are provided each cycle. Thus for the first portion of the cycles, D0 and D1 are provided at a slower speed than for the second portion of the cycles. Alignment and synchronization block 26, which may be referenced as a logic block, provides mode select signal MS to establish the change in frequency of mode clock MC provided by clock circuit 29. Mode select signal MS is also provided to RSD stage 22. RSD stage 22 has capacitances that are selected based on mode select MS which will be described in more detail.

Figure 3:
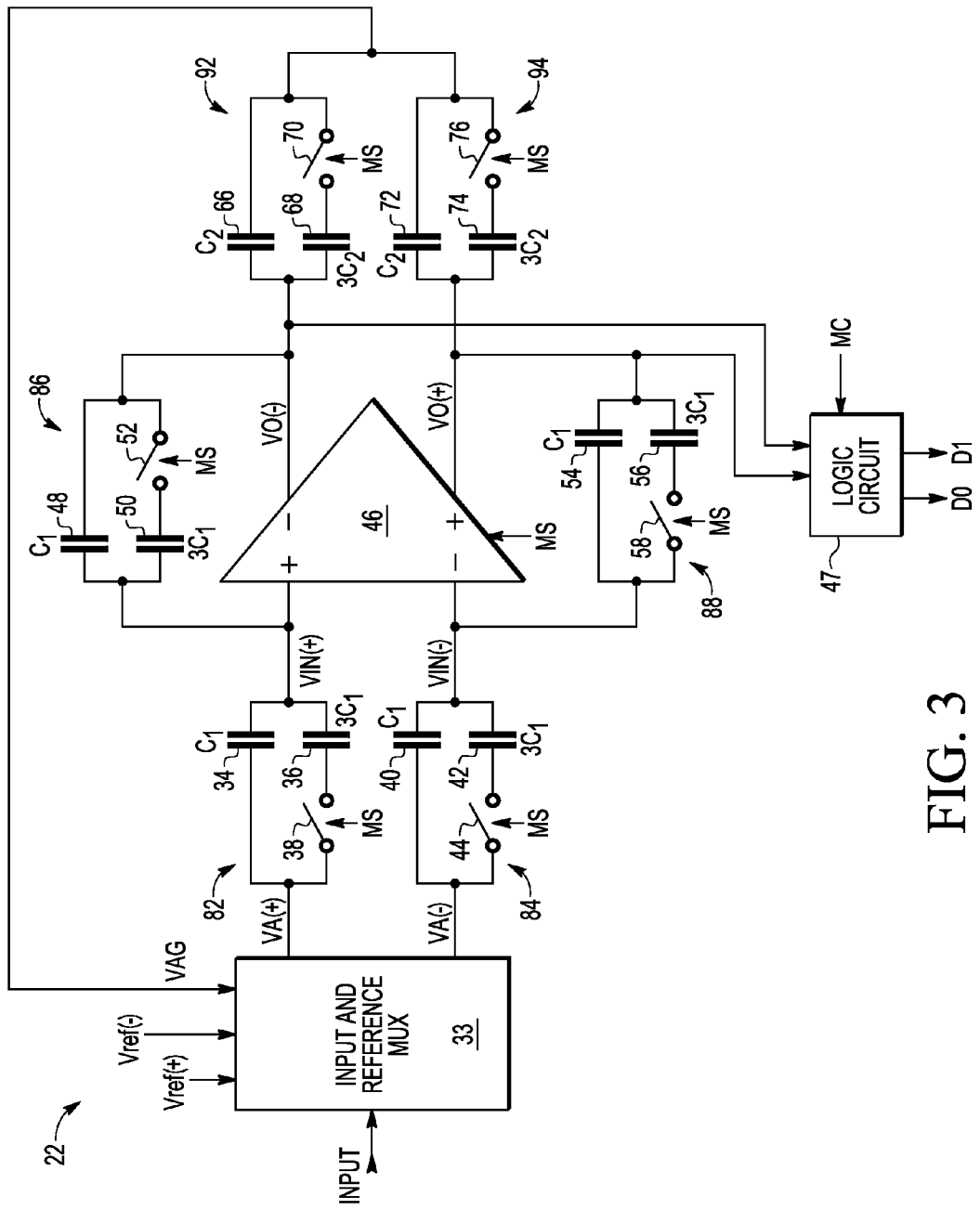
FIG. 3 is a combination circuit and block diagram of an RSD circuit of the single stage RSD A/D converter of FIG. 2.

Shown in FIG. 3 is a RSD stage 22 including an input and reference MUX 33, a variable capacitance circuit 82 that receives an output VA (+) from input and reference MUX 33, a variable capacitance circuit 84, a variable capacitance circuit 86, a variable capacitance circuit 88, a variable capacitance circuit 92, a variable capacitance circuit 94, an amplifier 46, and a logic circuit 47. Input and reference MUX 33 receives an INPUT, a positive reference Vref (+), a negative reference Vref (−), and a signal VAG and provides output VA(+) and output VA(−). Logic circuit 47 has a first input coupled to output VO(−), a second input coupled to output VO(+), an output for providing output D0, and an output for providing output D1. Amplifier 46 receives mode select MS to alter its capacitance based on the mode.

Variable capacitance circuit 82 includes a capacitor 34 having a first terminal for receiving output VA(+) and a second terminal coupled to an input VIN(+) of amplifier 46, a second capacitor 36 having a first terminal coupled to input VIN(+) of amplifier 46 and a second terminal, and a switch 38 controlled by a mode select MS having a first terminal coupled to the second terminal of capacitor 42 and a second terminal coupled to output VA(+) of amplifier 46. Variable capacitance circuit 84 includes a capacitor 40 having a first terminal for receiving output VA(−) and a second terminal coupled to an input VIN(−) of amplifier 46, a second capacitor 42 having a first terminal coupled to input VIN(−) of amplifier 46 and a second terminal, and a switch 44 controlled by mode select MS having a first terminal coupled to the second terminal of capacitor 42 and a second terminal coupled to output VA(−) of amplifier 46. Variable capacitance circuit 86 includes a capacitor 48 having a first terminal coupled to input VIN(+) and a second terminal coupled to an output VO(−) of amplifier 46, a second capacitor 50 having a first terminal coupled to input VIN(−) of amplifier 46 and a second terminal, and a switch 52 controlled by mode select MS having a first terminal coupled to the second terminal of capacitor 50 and a second terminal coupled to output VO(−) of amplifier 46. Variable capacitance circuit 88 includes a capacitor 54 having a first terminal coupled to input VIN(−) and a second terminal coupled to an output VO(+) of amplifier 46, a second capacitor 56 having a first terminal coupled to output VO(+) of amplifier 46 and a second terminal, and a switch 58 controlled by mode select MS having a first terminal coupled to the second terminal of capacitor 56 and a second terminal coupled to output VO(+) of amplifier 46. Variable capacitance circuit 92 includes a capacitor 66 having a first terminal coupled to output VO(−) and a second terminal coupled to an input of input and reference MUX 33 that receives signal VAG, a second capacitor 68 having a first terminal coupled to output VO(−) of amplifier 46 and a second terminal, and a switch 70 controlled by mode select MS having a first terminal coupled to the second terminal of capacitor 68 and a second terminal coupled to the second terminal of capacitor 66. Variable capacitance circuit 96 includes a capacitor 72 having a first terminal coupled to output VO(+) and a second terminal coupled to the input of input and reference MUX 33 that receives signal VAG, a second capacitor 68 having a first terminal coupled to output VO(+) of amplifier 46 and a second terminal, and a switch 76 controlled by mode select MS having a first terminal coupled to the second terminal of capacitor 74 and a second terminal coupled to the second terminal of capacitor 72.

The variable capacitance circuits provide a first capacitance during a first portion of the cycles and a second, lower capacitance, during a second portion of the cycles. The first portion may be 4 cycles and the second portion may be 9 cycles. In this case the capacitance during the second portion of the cycles is provided by a single capacitor. During the first portion of the cycles, the capacitance is provided at four times the capacitance of the capacitance during the second portion of the cycle by adding the capacitances together. For example, variable capacitance circuit 82 has capacitor 34 at a capacitance of C1 and capacitor 36 at three times that amount, capacitance 3C1. During the first portion of the cycles, switch 38 is closed in response to mode select MS and provides thus variable capacitance 82 provides a capacitance that is the sum of C1 and 3C1 which is 4C1. During the second portion of the cycles, mode select causes switch 38 to be open so that the capacitance supplied by variable capacitance circuit 82 is just the capacitance of capacitor 34, which is capacitance C1. Thus the ratio of capacitance for the first and second portions of the cycles is four. The ratio, however, can be different than four. Also, the manner of achieving the desired ratio may different from that shown. Variable capacitance circuits 86 and 88 also have capacitances C1 and 3C1. Variable capacitance circuits 92 and 94 have capacitances C2 and 3C2 resulting in the same ratio for the first and second portions of the cycles. For example, capacitance C2 may be twice capacitance C1.

Figure 4:
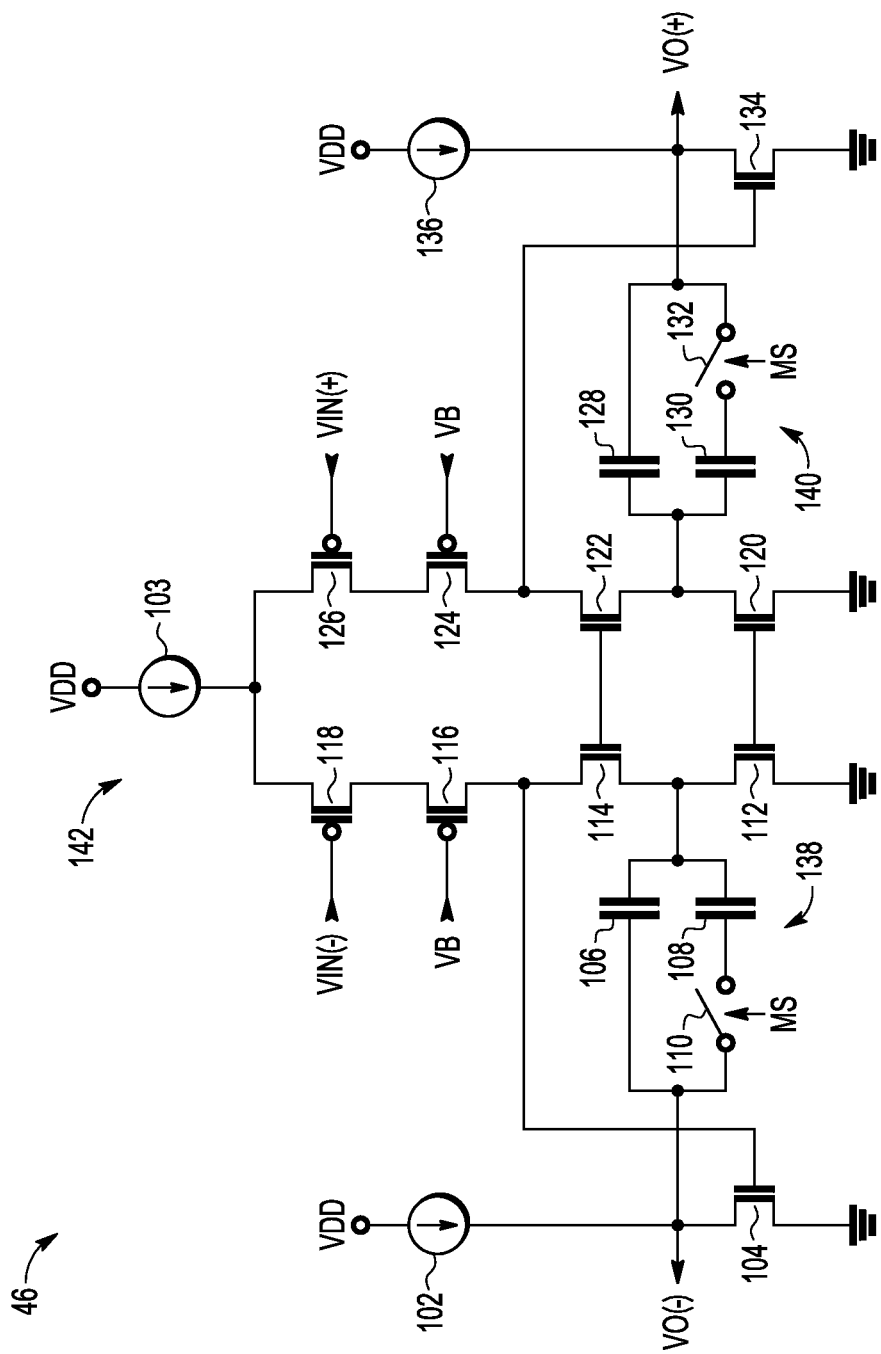
FIG. 4 is a schematic circuit diagram an amplifier of the RSD circuit of FIG. 3.

Shown in FIG. 4 is amplifier 46 including a current sources 102, 103, and 136; variable capacitance circuits 138 and 140, P channel transistors 116, 118, 124, and 126; and N channel transistors 104,112, 114, 122, 124, and 134. A telescopic stage 142 is comprised of P channel transistors 116, 118, 124, and 126; N channel transistors 112, 114, 120, and 122; and current source 103. Current source 102 has a first terminal coupled to a positive power supply terminal VDD and a second terminal coupled to a drain of transistor 104. Transistor 104 has a source coupled to a negative power supply terminal which may be ground and a gate connected to a drain of transistor 114. Transistors 112, 120, and 134 also have their sources coupled to negative power supply terminal. Transistors 114 and 122 have their gates connected together. Transistors 112 and 120 have their gates connected together. Variable capacitance circuit 138 includes a capacitor 108 having a first terminal connected to the drain of transistor 104 and a second terminal to the drain of transistor 112 and the source of transistor 114, a second capacitor 108 having a first terminal coupled to the drain of transistor 112 and source of transistor 114 and a second terminal, and a switch 38 controlled by mode select MS having a first terminal coupled to the second terminal of capacitor 108 and a second terminal coupled to the drain of transistor 104. Variable capacitance circuit 140 includes a capacitor 128 having a first terminal connected to the drain of transistor 134 and a second terminal to the drain of transistor 120 and the source of transistor 122, a second capacitor 130 having a first terminal coupled to the drain of transistor 120 and source of transistor 122 and a second terminal, and a switch 38 controlled by mode select MS having a first terminal coupled to the second terminal of capacitor 128 and a second terminal coupled to the drain of transistor 134. Current source 103 has a first terminal connected to VDD and a second terminal coupled to sources of transistors 118 and 126. Transistor 118 has a gate for receiving input VIN(−) and a drain connected to the source of transistor 116. Transistor 116 has a gate for receiving a bias voltage VB and a drain connected to the drain of transistor 114 and the gate of transistor 104. Transistor 126 has a gate for receiving input VIN(+) and a drain connected to the source of transistor 124. Transistor 124 has a gate for receiving a bias voltage VB and a drain connected to the drain of transistor 122 and the gate of transistor 134. Current source 136 has a first terminal connected to VDD and a second terminal connected to the drain of transistor 134. Transistor 134 has a gate connected to the drain of transistor 122.

As can be seen, amplifier 46 is a fully differential two stage amplifier that includes telescopic stage 142, which may be considered a first stage, and a second stage of transistors 104 and 134 and current sources 102 and 136. The second stage may be considered a common source stage.

In operation as an amplifier of an RSD circuit, amplifier 46 provides outputs VO(−) and VO(+) at the drains of transistors 104, and 134, respectively. During the first portion of the cycles, mode select MS causes switches 110 and 132 to be closed so that capacitors 106 and 108 are in parallel and capacitors 128 and 130 are in parallel. During the second portion of the cycles, mode select MS causes clock circuit 29 to increase in frequency for the second portion of the cycles. The digital signals D0 and D1, which are provided each cycle, are used in ultimately establishing a digital representation of the INPUT signal, which is the analog input, by digital circuit 24 after completion of the all of the cycles for a given INPUT signal. The cycles requiring higher resolution are performed at slower frequency and higher capacitance and the cycles not requiring as much resolution are performed at a higher frequency and with lower capacitance resulting in efficient achievement of the digital representation of the analog input. The lower frequency may be half the higher frequency.

Although the disclosure is described herein with reference to specific embodiments, various modifications and changes can be made without departing from the scope of the present disclosure as set forth in the claims below. For example, the particular construction of the capacitors may vary. Examples of capacitors include polysilicon, metal-insulator-metal (MIM), and metal oxide semiconductor transistors. Other capacitor types may be used as well. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

By now it should be apparent there has been disclosed a redundant signed digit (RSD) analog to digital converter (ADC). The RSD ADC includes an input circuit for receiving an input to the RSD ADC and having a first output and a second output. The RSD ADC further includes an amplifier. The RSD ADC further includes a first variable capacitance circuit having an input coupled to the first output of the input circuit and an output coupled to a first input of the amplifier. The RSD ADC further includes a second variable capacitance circuit having an input coupled to the second output of the input circuit and an output coupled to a second input of the amplifier. The RSD ADC further includes a third variable capacitance circuit having an input coupled to a first output of the amplifier. The RSD ADC further includes a fourth variable capacitance circuit having an input coupled to a second output of the amplifier. Outputs of the third and fourth capacitance circuits are coupled together and to the input circuit, and capacitance values of the first, second, third and fourth variable capacitance circuits are higher when input to the RSD ADC corresponds to a selected number of more significant bits than when input to the ADC corresponds to a remaining number of less significant bits. The RSD ADC may further include a fifth variable capacitance circuit coupled between the first output of the amplifier and the first input to the amplifier, and a sixth variable capacitance circuit coupled between the second output of the amplifier and the second input to the amplifier, wherein capacitance values of the fifth and sixth variable capacitance circuits are higher when the inputs to the ADC correspond to the selected number of more significant bits than when input to the ADC corresponds to the remaining number of less significant bits. The RSD ADC may further include a logic circuit that is operable to change a mode switch signal after processing the more significant bits, wherein the change in the mode switch signal causes the capacitance values of the first through sixth variable capacitance circuits to decrease. The RSD ADC may have a further characterization by which the logic circuit is operable to change a clock frequency according to the mode switch signal, wherein the more significant bits are processed at a first clock frequency that is lower than a second clock frequency used to process the less significant bits. The RSD ADC may have a further characterization by which the amplifier includes a telescopic stage coupled between a first supply voltage and a second supply voltage, the telescopic stage including a first branch and a second branch, a seventh variable capacitance circuit coupled to the first branch, and an eighth variable capacitance circuit coupled to the second branch, wherein capacitance values of the seventh and eighth variable capacitance circuits are higher when the input to the ADC corresponds to the selected number of more significant bits than when inputs to the ADC correspond to the remaining number of less significant bits. The RSD ADC may have a further characterization by which the change in the mode switch signal causes the capacitance values of the seventh and eighth variable capacitance circuits to decrease. The RSD ADC the change in the mode switch signal causes the capacitance values of the seventh and eighth variable capacitance circuits to decrease the first through eighth variable capacitance circuits include a first capacitive element coupled in parallel with a second capacitive element and a switch coupled in series with the second capacitive element, and the switch is operated by the mode switch signal. The RSD ADC may have a further characterization by which the amplifier is a fully differential two stage amplifier including a telescopic stage and a common source second amplifier stage, the telescopic stage is implemented with PMOS differential inputs and an NMOS load. The RSD ADC may have a further characterization by which the first and second capacitive elements are one of a group consisting of: metal-insulator-metal, polysilicon, and metal oxide semiconductor transistors. The RSD ADC may have a further characterization by which the capacitance of the first capacitive elements is greater than the capacitance of the second capacitive elements. The RSD ADC may have a further characterization by which the first clock frequency is one-half the second clock frequency.

Disclosed also is a redundant signed digit (RSD) analog to digital converter (ADC) including an RSD stage and a logic circuit configured to set a mode signal and to change a clock frequency according to the mode signal. The RSD stage includes an amplifier, a first variable capacitance circuit coupled between a first non-inverting input to the amplifier and a first output of the amplifier, and a The RSD ADC includes a second variable capacitance circuit coupled between a second inverting input to the amplifier and a second output of the amplifier. The logic circuit has a further characterization by which the mode signal is set to a first value when inputs to the RSD stage correspond to a selected number of most significant bits of a conversion process being converted from analog format to digital format, the mode signal is set to a second value when the inputs to the RSD stage correspond to a selected number of less significant bits of the conversion process, capacitance of the first and second variable capacitance circuits changes based on the first and second values of the mode signal, and most significant bits are processed at a first clock frequency that is lower than a second clock frequency used to process the less significant bits. The RSD ADC may have further characterization by which the amplifier includes a telescopic stage, a third variable capacitance circuit, and a fourth variable capacitance circuit, wherein the third variable capacitance circuit is coupled to a load portion of a first branch of the telescopic stage, the fourth variable capacitance circuit is coupled to a load portion of a second branch of the telescopic stage, and capacitance of the third and fourth variable capacitance circuits changes according to the first and second values of the mode signal. The RSD ADC may further include a fifth variable capacitance circuit coupled to a non-inverting input of the amplifier and a sixth variable capacitance circuit coupled to an inverting input of the amplifier, wherein capacitance of the fifth and sixth variable capacitance circuits changes according to the first and second values of the mode signal. The RSD ADC may further include a seventh variable capacitance circuit coupled to an inverting output of the amplifier and an eighth variable capacitance circuit coupled to a non-inverting output of the amplifier, wherein capacitance of the seventh and eighth variable capacitance circuits changes according to the first and second values of the mode signal. The RSD ADC may have further characterization by which the first through eighth variable capacitance circuits include a first capacitive element coupled in parallel with a second capacitive element and a switch coupled in series with the second capacitive element and the switch is operated by the mode signal. The RSD ADC may have further characterization by which the first through eighth variable capacitance circuits include a first capacitive element coupled in parallel with a second capacitive element and a switch coupled in series with the second capacitive element, the switch is operated by the mode signal. The RSD ADC may have further characterization by which capacitance of the first capacitive elements is greater than capacitance of the second capacitive elements. The RSD ADC may have further characterization by which the first clock frequency is one-half the second clock frequency.

Also disclosed is a method of operating a redundant signed digit (RSD) analog to digital converter (ADC). The method includes setting a mode signal to a first value when the ADC is processing a selected number of most significant bits of a conversion process being converted from analog to digital format. The method further includes setting the mode signal to a second value when the ADC is processing a selected number of less significant bits of the conversion process. The method further includes varying capacitance of first and second variable capacitance circuits coupled to respective first and second inputs of the amplifier, and of third and fourth variable capacitance circuits coupled to respective first and second outputs of the amplifier, the capacitances being varied according the first and second values of the mode signal. The method further includes increasing a frequency of a clock signal when the less significant bits are processed compared to the frequency of the clock signal when the most significant bits are processed. The method may further include varying capacitance of a fifth variable capacitance circuit coupled between the first input and the first output of the amplifier, and of a sixth variable capacitance circuit coupled between the second input and the second output of the amplifier and varying capacitance of seventh and eighth variable capacitance circuits coupled to a telescopic stage of the amplifier, the capacitances being varied according the first and second values of the mode signal.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A redundant signed digit (RSD) analog to digital converter (ADC), comprising:
    an input circuit for receiving an input to the RSD ADC and having a first output and a second output;
    an amplifier;
    a first variable capacitance circuit having an input coupled to the first output of the input circuit and an output coupled to a first input of the amplifier;
    a second variable capacitance circuit having an input coupled to the second output of the input circuit and an output coupled to a second input of the amplifier;
    a third variable capacitance circuit having an input coupled to a first output of the amplifier; and
    a fourth variable capacitance circuit having an input coupled to a second output of the amplifier;
    wherein outputs of the third and fourth capacitance circuits are coupled together and to the input circuit, and capacitance values of the first, second, third and fourth variable capacitance circuits are higher when input to the RSD ADC corresponds to a selected number of more significant bits than when input to the ADC corresponds to a remaining number of less significant bits.

2. The RSD ADC of claim 1, further comprising:
    a fifth variable capacitance circuit coupled between the first output of the amplifier and the first input to the amplifier; and
    a sixth variable capacitance circuit coupled between the second output of the amplifier and the second input to the amplifier;
    wherein capacitance values of the fifth and sixth variable capacitance circuits are higher when the inputs to the ADC correspond to the selected number of more significant bits than when input to the ADC corresponds to the remaining number of less significant bits.

3. The RSD ADC of claim 2, further comprising:
    a logic circuit that is operable to change a mode switch signal after processing the more significant bits, wherein the change in the mode switch signal causes the capacitance values of the first through sixth variable capacitance circuits to decrease.

4. The RSD ADC of claim 3, wherein:
    the logic circuit is operable to change a clock frequency according to the mode switch signal, wherein the more significant bits are processed at a first clock frequency that is lower than a second clock frequency used to process the less significant bits.

5. The RSD ADC of claim 2, wherein the amplifier comprises:
a telescopic stage coupled between a first supply voltage and a second supply voltage, the telescopic stage including a first branch and a second branch;
a seventh variable capacitance circuit coupled to the first branch; and
an eighth variable capacitance circuit coupled to the second branch;
wherein capacitance values of the seventh and eighth variable capacitance circuits are higher when the input to the ADC corresponds to the selected number of more significant bits than when inputs to the ADC correspond to the remaining number of less significant bits.

6. The RSD ADC of claim 5, wherein the change in the mode switch signal causes the capacitance values of the seventh and eighth variable capacitance circuits to decrease.

7. The RSD ADC of claim 6, wherein:
the first through eighth variable capacitance circuits include a first capacitive element coupled in parallel with a second capacitive element and a switch coupled in series with the second capacitive element, and the switch is operated by the mode switch signal.

8. The RSD ADC of claim 1, wherein the amplifier is a fully differential two stage amplifier including a telescopic stage and a common source second amplifier stage, the telescopic stage is implemented with PMOS differential inputs and an NMOS load.

9. The RSD ADC of claim 7, wherein the first and second capacitive elements are one of a group consisting of: metal-insulator-metal, polysilicon, and metal oxide semiconductor transistors.

10. The RSD ADC of claim 7, wherein the capacitance of the first capacitive elements is greater than the capacitance of the second capacitive elements.

11. The RSD ADC of claim 4, wherein the first clock frequency is one-half the second clock frequency.

12. A redundant signed digit (RSD) analog to digital converter (ADC), comprising:
an RSD stage including:
an amplifier;
a first variable capacitance circuit coupled between a first non-inverting input to the amplifier and a first output of the amplifier; and
a second variable capacitance circuit coupled between a second inverting input to the amplifier and a second output of the amplifier; and
a logic circuit configured to set a mode signal and to change a clock frequency according to the mode signal, wherein:
the mode signal is set to a first value when inputs to the RSD stage correspond to a selected number of most significant bits of a conversion process being converted from analog format to digital format;
the mode signal is set to a second value when the inputs to the RSD stage correspond to a selected number of less significant bits of the conversion process;
capacitance of the first and second variable capacitance circuits changes based on the first and second values of the mode signal; and
most significant bits are processed at a first clock frequency that is lower than a second clock frequency used to process the less significant bits.

13. The RSD ADC of claim 12, wherein the amplifier comprises:
a telescopic stage,
a third variable capacitance circuit;
a fourth variable capacitance circuit;
wherein the third variable capacitance circuit is coupled to a load portion of a first branch of the telescopic stage, the fourth variable capacitance circuit is coupled to a load portion of a second branch of the telescopic stage, and capacitance of the third and fourth variable capacitance circuits changes according to the first and second values of the mode signal.

14. The RSD ADC of claim 13, further comprising:
a fifth variable capacitance circuit coupled to a non-inverting input of the amplifier;
a sixth variable capacitance circuit coupled to an inverting input of the amplifier, and
wherein capacitance of the fifth and sixth variable capacitance circuits changes according to the first and second values of the mode signal.

15. The RSD ADC of claim 14, further comprising:
a seventh variable capacitance circuit coupled to an inverting output of the amplifier; and
an eighth variable capacitance circuit coupled to a non-inverting output of the amplifier,
wherein capacitance of the seventh and eighth variable capacitance circuits changes according to the first and second values of the mode signal.

16. The RSD ADC of claim 15, wherein:
the first through eighth variable capacitance circuits include a first capacitive element coupled in parallel with a second capacitive element and a switch coupled in series with the second capacitive element, the switch is operated by the mode signal.

17. The RSD ADC of claim 16, wherein capacitance of the first capacitive elements is greater than capacitance of the second capacitive elements.

18. The RSD ADC of claim 4, wherein the first clock frequency is one-half the second clock frequency.

19. A method of operating a redundant signed digit (RSD) analog to digital converter (ADC), the method comprising:
setting a mode signal to a first value when the ADC is processing a selected number of most significant bits of a conversion process being converted from analog to digital format;
setting the mode signal to a second value when the ADC is processing a selected number of less significant bits of the conversion process;
varying capacitance of first and second variable capacitance circuits coupled to respective first and second inputs of the amplifier, and of third and fourth variable capacitance circuits coupled to respective first and second outputs of the amplifier, the capacitances being varied according the first and second values of the mode signal; and
increasing a frequency of a clock signal when the less significant bits are processed compared to the frequency of the clock signal when the most significant bits are processed.

20. The method of claim 19, further comprising:
varying capacitance of a fifth variable capacitance circuit coupled between the first input and the first output of the amplifier, and of a sixth variable capacitance circuit coupled between the second input and the second output of the amplifier; and
varying capacitance of seventh and eighth variable capacitance circuits coupled to a telescopic stage of the amplifier, the capacitances being varied according the first and second values of the mode signal.

* * * * *